(12) United States Patent
Liou et al.

(10) Patent No.: US 11,749,563 B2
(45) Date of Patent: Sep. 5, 2023

(54) INTERLAYER DIELECTRIC LAYER

(71) Applicant: Taiwan Semiconductor Manufacturing Co., Ltd., Hsinchu (TW)

(72) Inventors: Joung-Wei Liou, Hsinchu (TW); Yi-Wei Chiu, Kaohsiung (TW); Bo-Jhih Shen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/138,106

(22) Filed: Sep. 21, 2018

(65) Prior Publication Data
US 2020/0006126 A1 Jan. 2, 2020

Related U.S. Application Data

(60) Provisional application No. 62/690,726, filed on Jun. 27, 2018.

(51) Int. Cl.
*H01L 21/768* (2006.01)
*H01L 23/532* (2006.01)

(52) U.S. Cl.
CPC .. *H01L 21/76829* (2013.01); *H01L 21/76802* (2013.01); *H01L 21/76826* (2013.01);
(Continued)

(58) Field of Classification Search
CPC ......... H01L 21/76829; H01L 21/76828; H01L 21/76826; H01L 21/02274;
(Continued)

(56) References Cited

U.S. PATENT DOCUMENTS

| 4,509,451 A | 4/1985 | Collins et al. |
| 5,429,995 A * | 7/1995 | Nishiyama ........ H01L 21/02271 438/788 |

(Continued)

FOREIGN PATENT DOCUMENTS

| CN | 1783479 A | 6/2006 |
| CN | 1787881 A | 6/2006 |

(Continued)

OTHER PUBLICATIONS

Leonhardt et al., Generation of electron-beam produced plasmas and applications to surface modification, Surface and Coatings Technology 177-178 (2004) 682-687 (Year: 2004).*

(Continued)

*Primary Examiner* — Shih Tsun A Chou
(74) *Attorney, Agent, or Firm* — Sterne, Kessler, Goldstein & Fox P.L.L.C.

(57) ABSTRACT

The present disclosure describes a method for forming a silicon-based, carbon-rich, low-k ILD layer with a carbon concentration between about 15 atomic % and about 20 atomic %. For example, the method includes depositing a dielectric layer, over a substrate, with a dielectric material having a dielectric constant below 3.9 and a carbon atomic concentration between about 15% and about 20%; exposing the dielectric layer to a thermal process configured to outgas the dielectric material; etching the dielectric layer to form openings; and filling the openings with a conductive material to form conductive structures.

20 Claims, 8 Drawing Sheets

(52) U.S. Cl.
CPC .. *H01L 21/76828* (2013.01); *H01L 21/76877* (2013.01); *H01L 23/53295* (2013.01)

(58) Field of Classification Search
CPC ......... H01L 23/53295; H01L 21/76802; H01L 21/76877
See application file for complete search history.

(56) References Cited

U.S. PATENT DOCUMENTS

| | | | |
|---|---|---|---|
| 5,717,251 A * | 2/1998 | Hayashi | G03F 7/095 |
| | | | 257/386 |
| 6,147,009 A * | 11/2000 | Grill | H01L 21/0228 |
| | | | 438/780 |
| 6,441,491 B1 * | 8/2002 | Grill | H01L 21/02216 |
| | | | 257/759 |
| 6,537,925 B2 | 3/2003 | Kim et al. | |
| 6,583,048 B2 * | 6/2003 | Vincent | B05D 1/60 |
| | | | 257/E21.26 |
| 6,846,515 B2 * | 1/2005 | Vrtis | C23C 16/401 |
| | | | 427/294 |
| 6,962,869 B1 * | 11/2005 | Bao | H01L 21/3105 |
| | | | 257/E21.576 |
| 7,288,292 B2 | 10/2007 | Gates et al. | |
| 7,482,265 B2 | 1/2009 | Chen et al. | |
| 7,485,582 B2 | 2/2009 | Nguyen et al. | |
| 7,855,142 B2 | 12/2010 | Oh et al. | |
| 2001/0000415 A1 * | 4/2001 | Ross | H01L 21/02118 |
| | | | 257/E21.279 |
| 2002/0142579 A1 | 10/2002 | Vincent et al. | |
| 2002/0155695 A1 * | 10/2002 | Lee | H01L 21/76832 |
| | | | 438/622 |
| 2004/0137758 A1 * | 7/2004 | Li | C23C 16/30 |
| | | | 438/781 |
| 2005/0230834 A1 | 10/2005 | Schmitt et al. | |
| 2005/0245100 A1 * | 11/2005 | Wu | H01L 21/02211 |
| | | | 438/790 |
| 2006/0079099 A1 * | 4/2006 | Nguyen | H01L 21/02351 |
| | | | 438/789 |
| 2007/0020952 A1 * | 1/2007 | Lin | H01L 21/0206 |
| | | | 438/778 |
| 2008/0268177 A1 | 10/2008 | Vrtis et al. | |
| 2009/0075491 A1 * | 3/2009 | Liu | H01L 21/3105 |
| | | | 438/800 |
| 2012/0074535 A1 * | 3/2012 | Huang | C09D 183/14 |
| | | | 257/632 |
| 2017/0054023 A1 | 2/2017 | Li et al. | |
| 2017/0140925 A1 | 5/2017 | Suzuki et al. | |
| 2018/0226460 A1 | 8/2018 | Zhu et al. | |
| 2019/0318923 A1 * | 10/2019 | Blanquart | H01L 21/0234 |

FOREIGN PATENT DOCUMENTS

| | | | |
|---|---|---|---|
| CN | 1957108 A | 5/2007 | |
| CN | 101005023 A | 7/2007 | |
| CN | 101575700 A | 11/2009 | |
| CN | 106469653 A | 3/2017 | |
| CN | 106711025 A | 5/2017 | |
| KR | 20020048623 A | 6/2002 | |
| KR | 20020062192 A | 7/2002 | |
| KR | 20100074631 A | 7/2010 | |
| KR | 20100082714 A | 7/2010 | |

OTHER PUBLICATIONS

Walton et al., Characterizations of Electron Beam-Generated Plasmas, 46th Annual Technical Conference Proceedings (2003) 21-25 (Year: 2003).*

Walton et al., Deposition of Silicon Dioxide Films Using Electron Beam-Generated Plasmas, 48th Annual Technical Conference Proceedings (2005) 5-9 (Year: 2005).*

"Important Parameters of an Electron Beam," published Mar. 21, 2014, https://ebeamservices.com/blog/important-parameters-electron-beam-understanding-energy-mev-current-ma-line-speed-matter/ (Year: 2014).*

Grill et al., Low Dielectric Constant SiCOH Films as Potential Candidates for Interconnect Dielectrics, Mat. Res. Soc. Symp. Proc. vol. 565, 1999, pp. 107-116 (Year: 1999).*

Rusli et al., Effects of annealing on low dielectric constant carbon doped silicon oxide films, Diamond & Related Materials 15 (2006) 133-137 (Year: 2006).*

Wikipedia: Ultraviolet—archived Jan. 2016 (Year: 2016).*

Lee et al., Characteristics of low-k SiOC films deposited via atomic layer deposition, Thin Solid Films 645 (2018) 334-339 (Year: 2017).*

* cited by examiner

INTERLAYER DIELECTRIC LAYER

CROSS-REFERENCE TO RELATED APPLICATION

This application claims the benefit of U.S. Provisional Patent Application No. 62/690,726, titled "INTERLAYER DIELECTRIC LAYER," which was filed on Jun. 27, 2018 and is incorporated herein by reference in its entirety.

BACKGROUND

Integrated circuit (IC) fabrication processing is performed successively in layers which are formed on top of each other over a substrate (e.g., a wafer). An IC can include a large numbers of layers (e.g., hundreds) depending on the design complexity and application. These layers are separated from each other by interlayer dielectric (ILD) layers.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
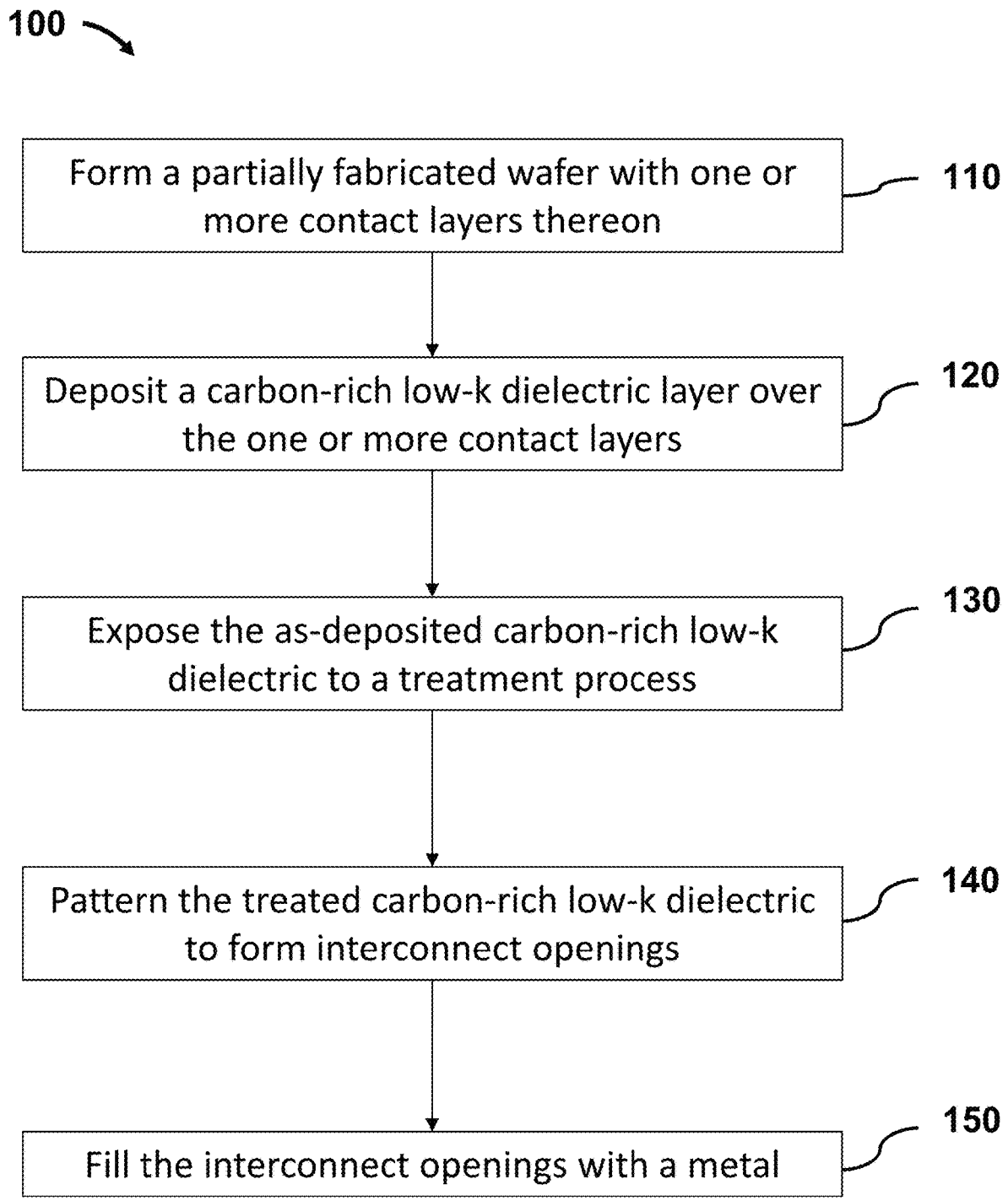
FIG. 1 is a flow chart of a method that describes the fabrication of a carbon-rich low-k interlayer dielectric layer, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances. Unless defined otherwise, technical and scientific terms used herein have the same meanings as commonly understood by one of ordinary skill in the art to which this disclosure belongs.

The term "substantially" as used herein indicates the value of a given quantity that can vary based on a particular technology node associated with the subject semiconductor device. Based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. Based on the particular technology node, the term "about" can indicate a value of a given quantity that varies within, for example, 5-30% of the value (e.g., ±5%, ±10%, ±20%, or ±30% of the value).

Back end of the line (BEOL) layers in integrated circuits (ICs) are separated by interlayer dielectric (ILD) layers having a low dielectric constant ("low-k"). For example, low-k ILD layers (or lower-k dielectric layers) can have a dielectric constant value below 3.9 (e.g., 3.2 or lower). Low-k ILD layers are desirable in BEOL because they can reduce parasitic capacitances between interconnects (e.g., vias and lines), and consequently mitigate the resistive-capacitive (RC) delays (signal delays) in the IC. However, as the ICs are scaled down from one technology generation (node) to the next, the spacing between vias in the BEOL layers (e.g., via pitch) is reduced accordingly. As a result, forming vias with vertical sidewalls (e.g., between about 84° and about 90°) can become challenging, and the likelihood of shorts between tightly spaced vias or lines is increased. Further, via pitch reduction can exacerbate etching loading effects ("loading effects")—e.g., an etch rate dependency on via density, via location (e.g., on a die or on the wafer), via size, or a combination thereof.

To address the above limitations, embodiments described herein are directed to a silicon-based, low-k ILD layer with a carbon atomic concentration that ranges between about 15% and about 20% (e.g., carbon-rich). In some embodiments, the carbon-rich low-k ILD layer can be a porous material. Due to its elevated carbon content, the low-k ILD layer can exhibit improved mechanical strength, mitigate loading effects and provide improved via profile control for vias with pitch between about 20 nm and about 130 nm (e.g., 28 nm). According to some embodiments, certain film properties of the carbon-rich low-k ILD layer—such as density, porosity, adhesion and surface quality—can be tuned with a post-deposition treatment. In some embodiments, the post-deposition treatment includes an ultraviolet treatment, a thermal treatment, a plasma treatment, an electron beam (e-beam) treatment, or combinations thereof. According to some embodiments, the bottom sidewall angle of the formed vias within the silicon-based, carbon-rich, low-k ILD layer described herein can range from about 84° to about 90° (e.g., about 86°). Further, the via height difference between isolated vias and dense vias (e.g., due to the etch loading effects) can be about 50 Å or less.

FIG. 1 is a flow chart of a fabrication method 100 that describes the fabrication of a carbon-rich, low-k ILD layer, according to some embodiments. Other fabrication operations can be performed between the various operations of fabrication method 100 and are omitted merely for clarity. Further, fabrication method 100 may not be limited to the operations described below and other operations can be performed.

Figure 2:
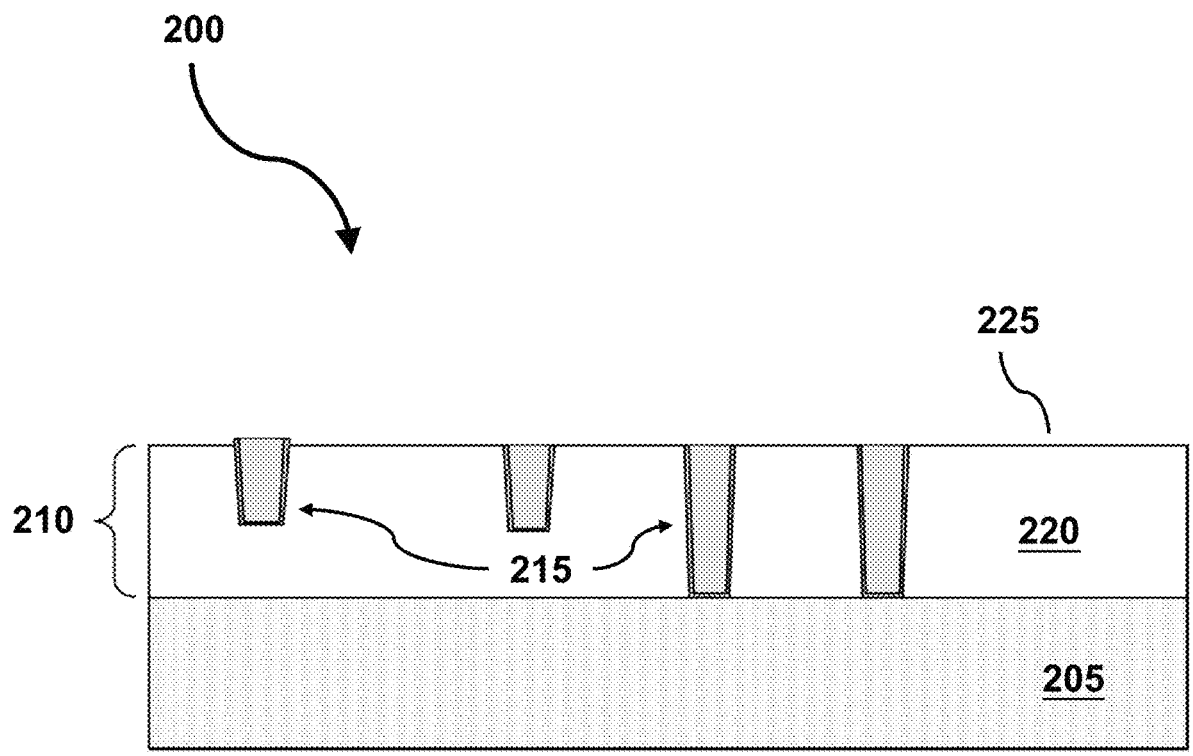
FIG. 2 is a cross-sectional view of a partially fabricated wafer, according to some embodiments.

In some embodiments, fabrication method 100 starts with operation 110, where a partially fabricated wafer with one or more contact layers thereon is formed using semiconductor fabrication methods. In some embodiments, the one or more contact layers of the partial fabricated wafer are used as a starting point for subsequent operations of fabrication method 100. The partially fabricated wafer can include one or more previously formed layers over a substrate. By way of example and not limitation, the partially formed wafer can include, field effect transistors (FETs), doped regions, memory arrays, capacitor structures, one or more contact layers, resistor structures, and the like. According to some embodiments, FIG. 2 is a simplified partially fabricated wafer 200 according to the above description. More specifically, partially fabricated wafer 200 can include layer 210 that is formed over substrate 205. As discussed above, additional components (e.g., FETs, doped regions, capacitor structures, resistor structures, memory arrays, etc.) can be formed between layer 210 and substrate 205. These additional components are not shown in FIG. 2 merely for simplicity, however these components are within the spirit and the scope of the present disclosure.

In some embodiments, substrate 205 can be a bare semiconductor bulk substrate, a top layer of a semiconductor on insulator (SOI) substrate, or any other suitable substrate material. By way of example and not limitation, substrate 205 can include silicon (Si) or another elementary semiconductor such as (i) germanium (Ge); (ii) a compound semiconductor including silicon germanium (SiGe), silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. In some embodiments, substrate 205 can be a non-semiconductor substrate, such as quartz.

In some embodiments, layer 210 includes metal contacts 215, which can be filled with cobalt (Co), tungsten (W), another suitable conductive material, or combinations thereof. By way of example and not limitation, layer 210 may include metal contacts 215 with, for example, different depths or heights, as shown in FIG. 2. Metal contacts 215 are embedded in ILD layer 220 or ILD layer stack 220. By way of example and not limitation, ILD layer 220 can include silicon oxide ($SiO_2$), silicon oxycarbide ($SiO_xC$), silicon oxynitride (SiON), silicon oxycarbon nitride (SiOCN), silicon carbide (SiC), silicon carbon nitride (SiCN), or a combination thereof. Further, the thickness of ILD layer 220 can range from about 10 nm to about 40 nm. The aforementioned thickness range for ILD layer 220 is not limiting and thicker or thinner ILD layers outside the provided range are possible. Further, layer 210 can have an etch stop layer 225 (disposed thereon) of about 10 nm on ILD layer 220. By way of example and not limitation, etch stop layer 225 can be a nitride, such as silicon nitride (SiN).

Figure 3:
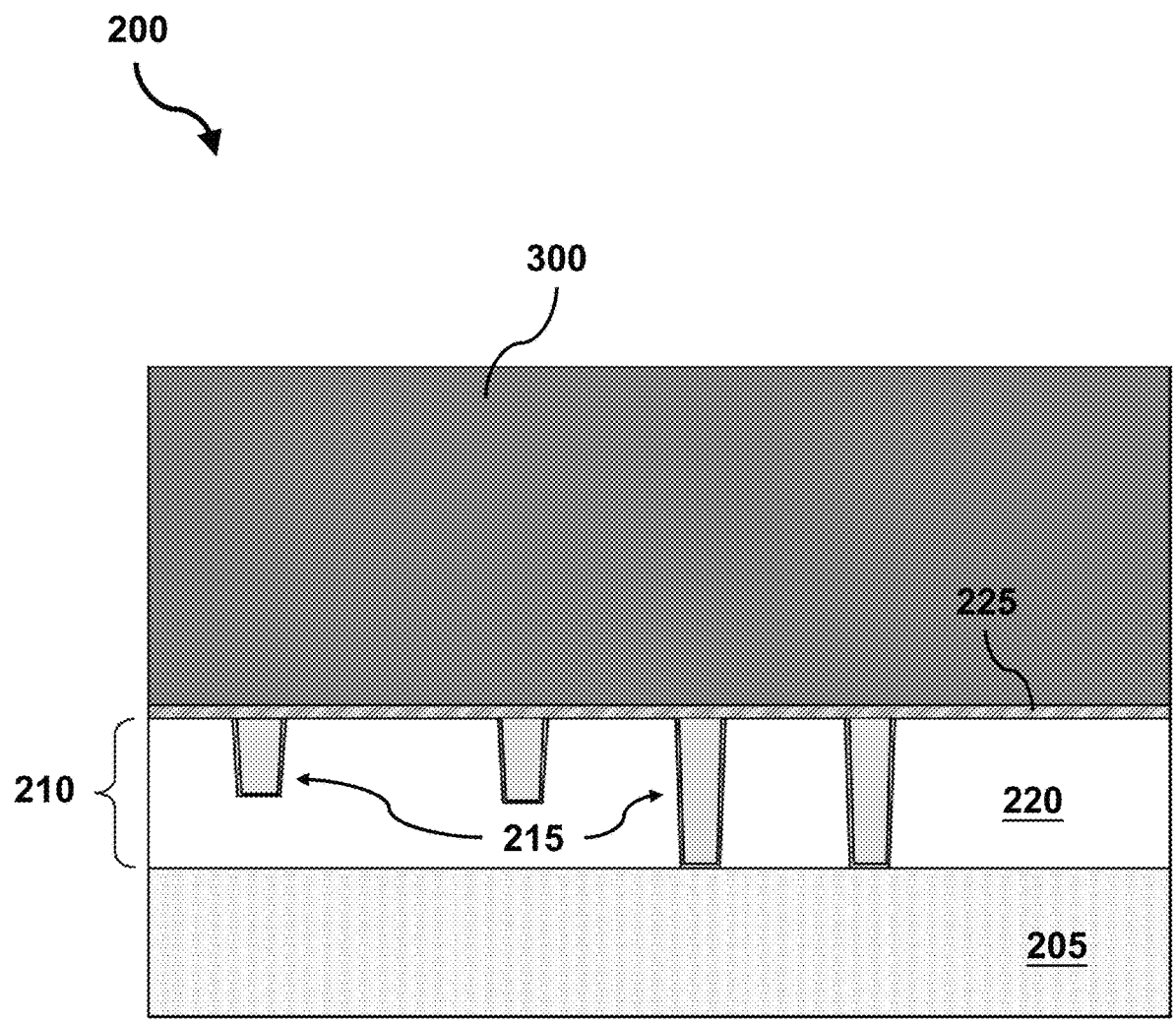
FIG. 3 is a cross-sectional view of a partially fabricated wafer with an as-deposited carbon-rich low-k dielectric layer, according to some embodiments.

In referring to FIG. 1, fabrication method 100 continues with operation 120 and the deposition of a carbon-rich, low-k dielectric layer that is formed over layer 210 on etch stop layer 225. According to some embodiments, FIG. 3 shows the partially fabricated wafer 200 after the deposition of carbon-rich, low-k layer 300. In some embodiments, carbon-rich, low-k layer 300 (also referred to herein as "as-deposited layer 300") is a dielectric material (e.g., a silicon-based material with silane or siloxane functional groups) that includes an elevated concentration of carbon. For example, the concentration of carbon in low-k layer 300 can range from about 15% to about 20%. The amount of carbon incorporated into low-k layer 300 can originate, from the precursor used to deposit it. In some embodiments, carbon-rich, low-k layer 300 can be subsequently treated to form a network of pores if a porogen precursor or "filler" is added during the deposition of carbon-rich, low k layer 300.

The deposition of carbon-rich, low-k layer 300 can be performed using a plasma-enhanced chemical vapor deposition (PECVD) process, an atomic layer deposition (ALD) process, a plasma assisted atomic layer deposition process (PEALD), or an electron beam (e-beam) assisted deposition process, according to some embodiments. By way of example and not limitation, in the example of a PECVD process, the precursor can be introduced into a plasma (e.g., an oxygen plasma) to deposit carbon-rich, low-k layer 300. In some embodiments, precursors that can be used to deposit carbon-rich, low-k layer 300 include, but are not limited to, tetraethyl orthosilicate (TEOS), methyl-diethoxy-silane (mDEOS), dimethyl dimethoxy silane (DMDMOS), dimethoxytetramethyldisiloxane (DMTMDSO), octamethylcyclotetrasiloxane (OMCTS), tetramethylcyclotetrasiloxane (TMTCS), diethoxymethylsilane (DEMS), tri-methylsilane (3MS), or tetra-methylsilane (4MS). By way of example and not limitation, the aforementioned precursors can be diluted in an inert gas, such as helium or argon.

In some embodiments, the formation of pores in carbon-rich, low-k layer 300 may be desired. To form the pores, a porogen precursor can be added during deposition. In some embodiments, porogen precursors that can be used to form pores in carbon-rich, low-k layer 300 include, but are not limited to, propane ($C_3H_8$), benzene ($C_6H_6$), or alpha-terpinene (ATRP) ($C_{10}H_{16}$). The formation of pores is completed by exposing as-deposited layer 300 to ultraviolet (UV) light, where outgassing of hydrocarbons from the bulk of the layer leaves behind a network of pores into the layer.

In some embodiments, the PECVD process can be performed at a temperature between about 100° C. and about 500° C., and at a pressure between about 0.5 Torr to about 20 Torr (e.g., about 5 Torr). A radio frequency (RF) power supply can provide power to the oxygen plasma. The RF power applied to the oxygen plasma can be between about 200 Watts and about 600 Watts (e.g., 500 Watts). During the PECVD deposition, the flow rate ratio between the precursor (e.g., TEOS, mDEOS, DEMS, 3MS, or 4MS) and the oxygen gas is high and can range from about 25 to about 100. Additionally, the total gas flow in the PECVD reactor can range from about 1500 sccm to about 5000 sccm. In some embodiments, a higher carbon concentration is achieved with higher flow rate ratios (e.g., about 100). It has to be noted that the above ranges are exemplary and not limiting. For example, depending on the precursor, other process ranges may be used to deposit low-k layer 300 with the desired carbon concentration.

An ALD (e.g., thermal) or a PEALD (e.g., plasma) process, may use the same or different precursors from the PECVD process described above. For example, a precursor chemistry for an ALD process may include TEOS and/or hexamethyldisilazane (HMDS, $HN[Si(CH_3)_3]_2$). Reactant gases in an ALD or PEALD process can include nitrogen, argon, oxygen, helium, hydrogen, any other suitable gas, or combinations thereof. In the PEALD process, the aforementioned gases can be used to generate a plasma that can receive about 20 Watts to about 1000 Watts of power from an external RF power supply. In some embodiments, the ALD or PEALD process is performed at a deposition temperature between about 100° C. and about 500° C., and at a process pressure between about 10 mTorr and about 10 Torr. An ALD or PEALD process can include more than one multi-step cycle. By way of example and not limitation, a single multi-step cycle in an exemplary ALD or PEALD process can include the following steps: (i) precursor flow, (ii) precursor purge, (iii) reactant gas flow with or without plasma ignition, and (v) purge. The aforementioned process steps and ranges are exemplary and not limiting.

In an e-beam assisted or e-beam induced deposition, the precursor can be introduced through a gas inlet on a top surface of etch stop layer 225. The e-beam can be used to promote the reaction between the precursor and reactant gases on the surface of the substrate. By way of example and not limitation, deposition can occur when the precursor and the reactant gas molecules interact with the e-beam on the surface of the wafer. The substrate temperature during the e-beam induced deposition can be lower than that of a PECVD or a PEALD/ALD process. For example, the temperature for the e-beam induced deposition can range from about room temperature (e.g., 24° C.) to about 300° C. (e.g., 24° C., 40° C., 80° C., 110° C., 200° C., 240° C., 300° C., etc.). The gas inlet can be, for example, an orifice having a diameter that can be adjusted according to the precursor's gas pressure so that a constant flow of reactants is provided to the surface of etch stop layer 225 during the e-beam deposition process. By way of example and not limitation, the precursor can include TEOS, mDEOS, DEMS, hexamethyldisiloxane (HMDSO), 3MS or 4MS diluted in helium or argon. If desired, one or more porogen precursors can be used during deposition. The porogen precursors can include a hydrocarbon source, such as propane, benzene, or ATRP. The power provided for the e-beam generation can range from about 0.5 kW to about 30 kW (e.g., from 0.5 kW to 10 kW, from 5 kW to 15 kW, from 10 kW to 30 kW, etc.). Reactant gases that can be used during the e-beam induced deposition process include—but are not limited to—nitrogen, argon, oxygen, helium, hydrogen, any other suitable gas, or combinations thereof at a pressure between about 0.01 mTorr and about 30 mTorr. The deposition rate depends on a variety of processing parameters, such as the partial pressure of the precursor(s), the substrate temperature, the electron beam parameters, etc. The deposition rate for an e-beam induced deposition can be in the order of several nm/s (e.g., equal to or greater than about 10 nm/s).

Figure 4:
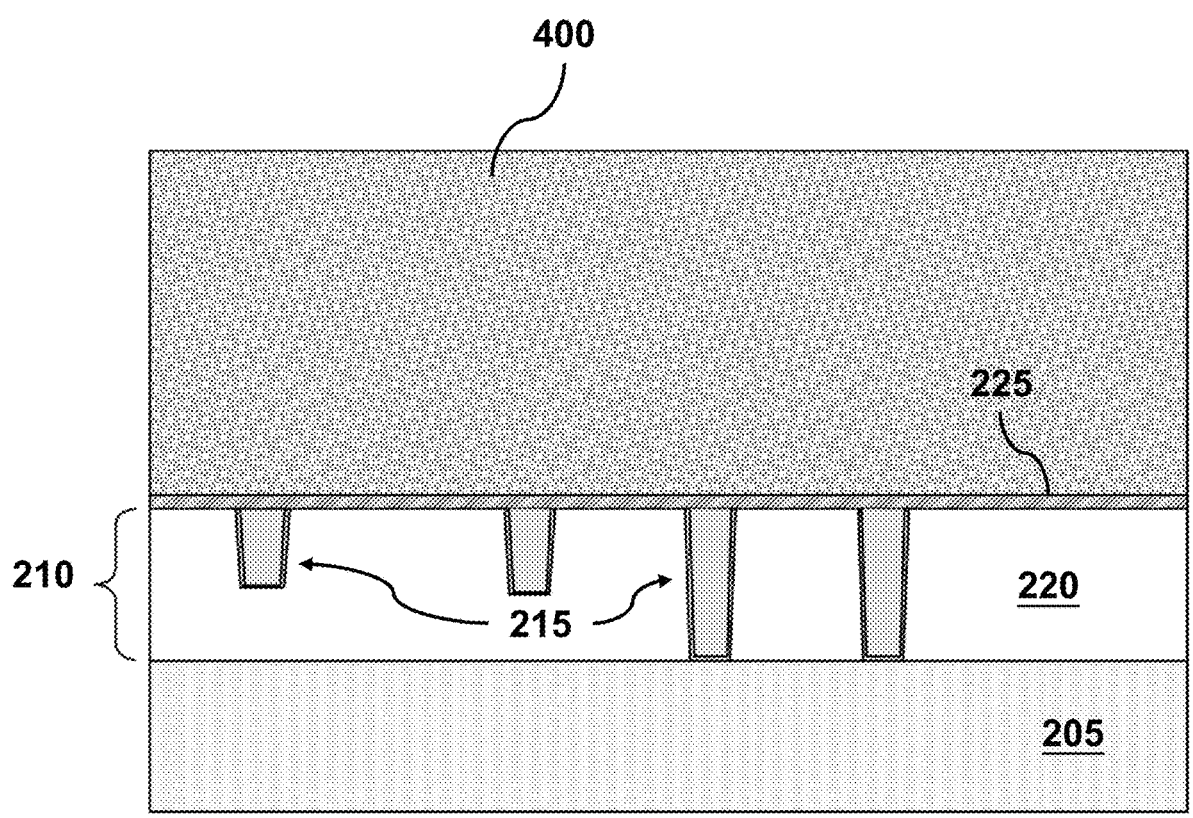
FIG. 4 is a cross-sectional of a partially fabricated wafer with a treated carbon-rich low-k dielectric layer, according to some embodiments.

Referring to FIG. 1 and operation 130, the as-deposited carbon-rich, low-k layer 300 is exposed to treatment process. After the treatment process of operation 130, the as-deposited, carbon-rich, low-k layer 300 is "converted" to a treated, carbon-rich, low-k ILD layer 400 (also referred to herein as "treated layer 400") shown in FIG. 4. By way of example and not limitation, treated layer 400 can have: a network of pores (e.g., if a porogen precursor was used during deposition); a carbon content (e.g., in atomic percentage) between about 15% and about 20%, as measured by x-ray photoelectron spectroscopy (XPS); a refractive index between about 1.42 and about 1.48, as measured by ellipsometry; a density between about 1.2 $gr/cm^3$ and about 1.4 $gr/cm^3$, as measured by x-ray reflectometry; and a k-value below about 3.0 (e.g., 2.9). In some embodiments, treated layer 400 is denser than as-deposited layer 300. Further, depending on the treatment, treated layer 400 can have improved etching characteristics compared to as-deposited layer 300. In some embodiments, the carbon content of the treated layer 400 is the same with the carbon content of the as-deposited layer 300 (e.g., between about 15% and about 20%).

According to some embodiments, different treatment processes have different effects on the as-deposited layer. For example, some treatment processes target the bulk of the as-deposited layer, while other treatments target the exposed surfaces of the as-deposited layer. If a porogen is used during the deposition of layer 300, a network of pores will be formed in treated layer 400. Although, the network of pores can reduce the overall dielectric constant of the film to values below 3.9 (e.g., about 2.5), it can also degrade the mechanical strength of the resulting low-k ILD layer. For example, a porous low-k ILD layer may collapse when subjected to processes or operations that induce significant mechanical stress, such as chemical planarization (CMP), thermal processing, wafer handling, etc. In some embodiments, increasing the carbon concentration of the porous low-k ILD layer improves its mechanical strength without adversely affecting the layer's dielectric constant. In some embodiments, the treatment process can include additives or ambient gases that can increase (e.g., boost) the carbon concentration of treated layer 400. In some embodiments, some treatments can densify as-deposited layer 300 by removing water, carbon dioxide, and/or loosely bonded hydrocarbons (e.g., $—CH_3$).

By way of example and not limitation, the treatment process can be performed at a temperature between about 24° C. and about 500° C. The treatment process can include a thermal process, a plasma process, a UV process, an e-beam process, any other suitable treatment process, or combinations thereof to achieve the desired carbon concentration, density, k-value, index of refraction, and/or etching characteristics in treated layer 400.

In a thermal treatment, the carbon-rich, low-k layer 300 can be annealed at a temperature between about 100° C. and about 500° C. in an ambient that can include one or more gases. For example the ambient can include helium, argon, nitrogen, hydrogen, carbon monoxide, carbon dioxide, nitrous oxide, any other suitable gas, or combinations thereof. An objective of the thermal process is to densify as-deposited layer 300 by removing moisture (e.g., water), carbon dioxide, carbon monoxide or loosely bonded hydrocarbons (e.g., $—CH_3$). Another objective of the thermal process is to strengthen the bonding between the silicon atoms, the carbon atoms, the hydrogen atoms and the oxygen atoms. As discussed above, additives can be incorporated in the gas mixture to boost the carbon concentration of as-deposited layer 300. By way of example and not limitation, such additives can include silane, 3MS, 4MS, mDEOS, any other suitable additives that can introduce carbon, or combinations thereof. In some embodiments, the thermal treatment densifies the bulk of as-deposited layer 300.

A plasma treatment process can employ the same gas chemistry with the thermal treatment process to produce a plasma, according to some embodiments. The plasma can interact with the exposed surfaces of layer 300 to improve the adhesion of materials that will be subsequently deposited on the exposed surface of treated layer 400. By way of example and not limitation, the plasma treatment process can be performed subsequently to a thermal treatment process. According to some embodiments, the plasma treatment can be performed at the same or at a lower temperature than the thermal treatment process. By way of example and not limitation, if the thermal treatment is performed at 500° C., the plasma treatment can be performed at 500° C. or below 500° C. By way of example and not limitation, the plasma power in a plasma treatment process can range from about 100 Watts to about 500 Watts (e.g., 100 Watts, 200 Watts, 250 Watts, 400 Watts, etc.).

In a UV treatment process, the as-deposited layer 300 can be subjected to UV radiation having a wavelength between about 150 nm and about 400 nm. The UV radiation exposure can be performed at a temperature between about 100° C. and about 500° C. in an ambient that includes helium, argon, nitrogen, hydrogen, any other suitable gas, or combinations thereof. Further, the process pressure during the UV treatment process can range from about 1 Torr to about 50 Torr. In some embodiments, the UV treatment process can have similar effects to a thermal treatment process. For example, the UV treatment process can densify as-deposited layer 300 by removing loosely bonded hydrocarbons (e.g., —$CH_3$). If a porogen precursor is used during the deposition of layer 300, the UV treatment can lead to the formation of a pore network in treated layer 400. In other words, treated layer 400 would become porous after the UV treatment if a porogen precursor was used during the deposition of carbon-rich low-k layer 300.

According to some embodiments, the carbon-rich, low-k layer 300 can be subjected to an e-beam treatment process at a temperature between room temperature (e.g., about 24° C.) and about 300° C. (e.g., 24° C., 40° C., 80° C., 110° C., 200° C., 240° C., 300° C., etc.). The e-beam treatment process is performed in an ambient that can include nitrogen, argon, oxygen, helium, hydrogen, carbon monoxide, carbon dioxide, nitrous oxide, any other suitable gas, or combinations thereof. Further, the pressure during the process can range from about 0.01 mTorr to about 100 mTorr. In some embodiments, the power supplied for the e-beam generation can range from about 100 Watts to about 500 Watts. In some embodiments, the e-beam treatment process can be used to treat both the exposed surfaces and the bulk of as-deposited layer 300.

Referring to FIG. 1, fabrication method 100 continues with operation 140 where treated, carbon-rich, low-k layer 400 is patterned to form interconnect openings therein. The patterning process of treated, carbon-rich, low-k layer 400 will be described below. Hard mask layer 500 shown in FIG. 5 can be blanket deposited over treated, carbon-rich, low-k layer 400. In some embodiments, hard mask layer 500 can include a two-layer stack with a bottom oxide layer 505 and a top antireflective coating 510. In some embodiments, bottom oxide layer 505 can be a silicon oxide layer and antireflective coating 510 can be a nitrogen-free antireflective coating (NFARC). Antireflective coating 510 can suppress UV or extreme ultra violet (EUV) light reflections during a subsequent photolithography step (described next) and minimize undesirable generation of standing waves. Standing waves can increase the edge roughness of the resulting patterned structures. Antireflective coating 510 also forms a flat surface, on which a photoresist layer (not shown in FIG. 5) can be formed during the photolithography step, by operating as a "filler" that fills small imperfections of oxide layer 505.

Figure 5:
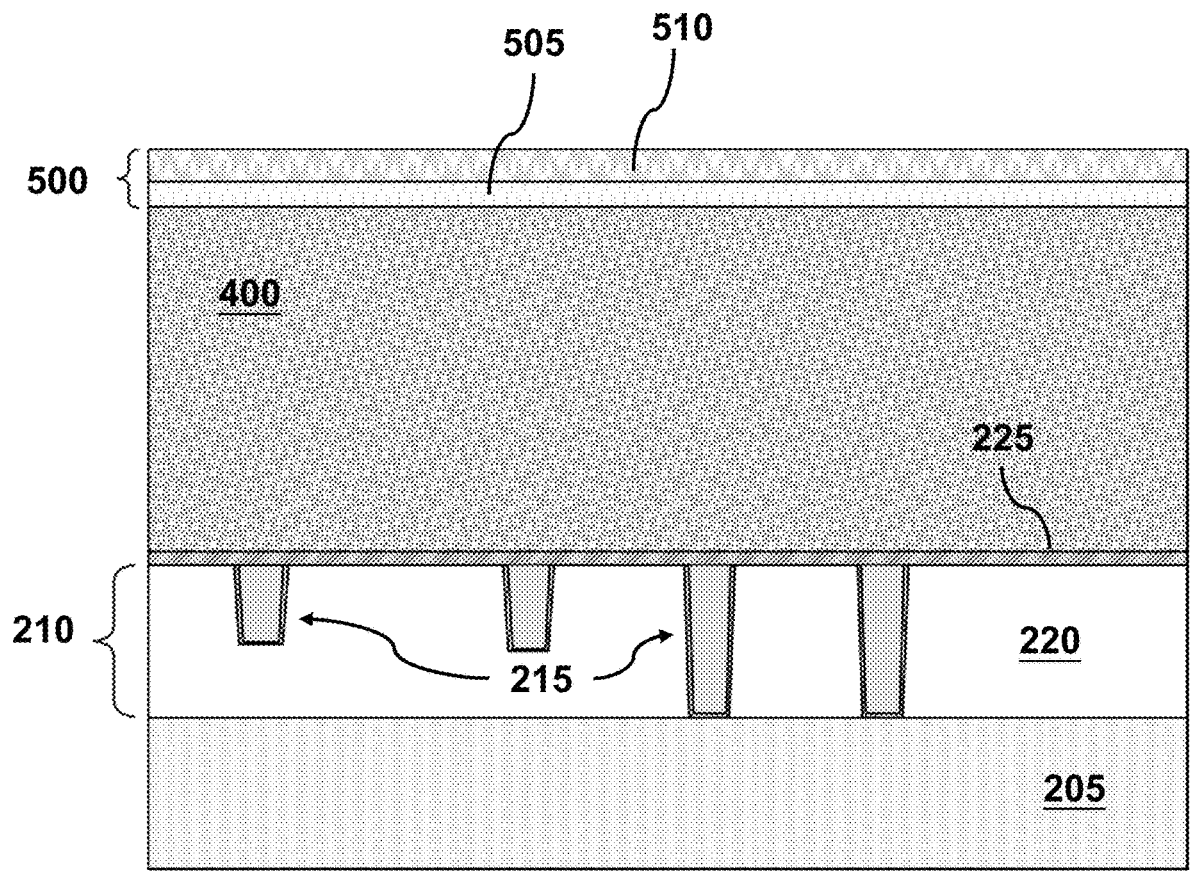
FIGS. 5-7 are cross-sectional views of a carbon-rich low-k interlayer dielectric layer on a partially fabricated wafer during various processing steps that describe the formation of interconnect openings in the carbon-rich low-k interlayer dielectric layer, according to some embodiments.
Figure 6:
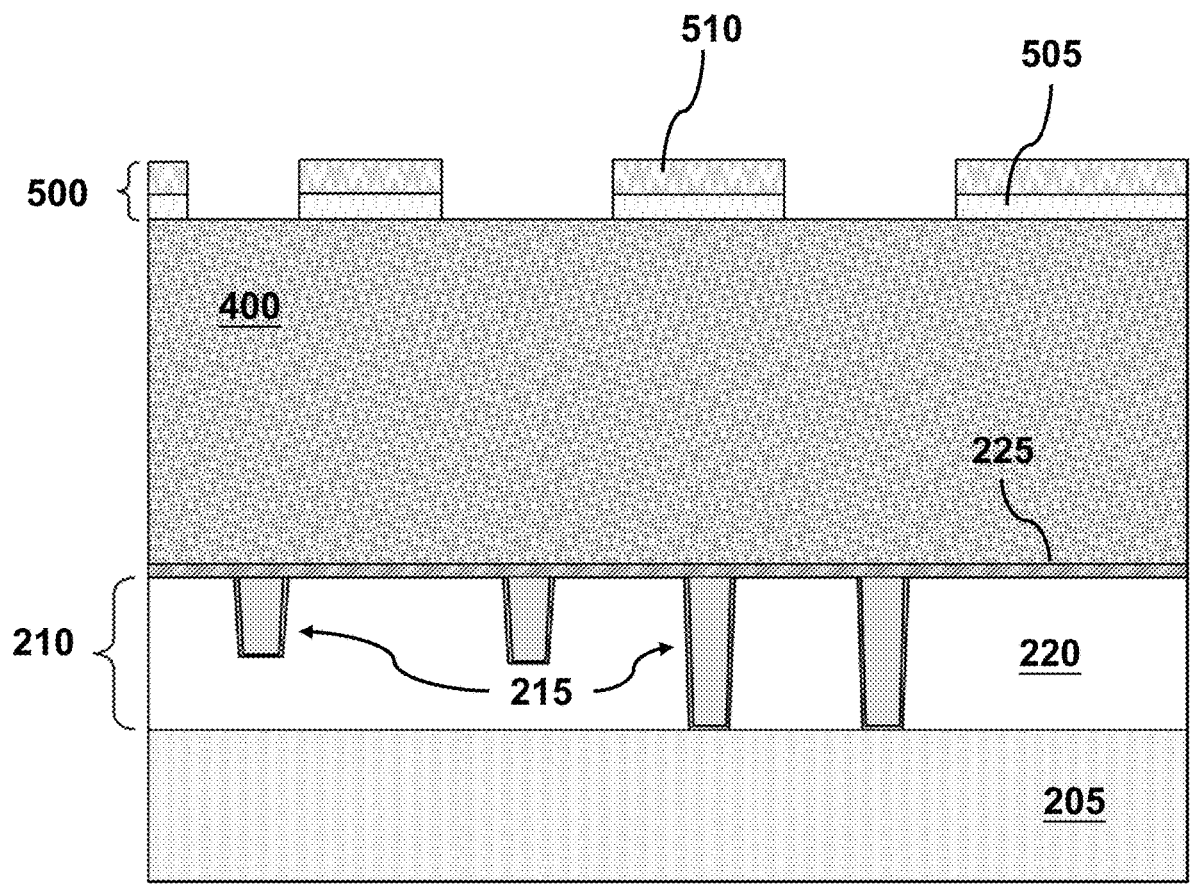

In a subsequent photolithography operation, a photoresist, not shown in FIG. 5, can be spin coated over anti-reflective coating 510 and subsequently patterned so that openings can be formed in the photoresist over antireflective coating 510. The openings in the photoresist form a pattern that exposes parts of the top surface of antireflective coating 510. By way of example and not limitation, the openings in the photoresist can be selectively aligned to some or all of the metal contacts 215 of layer 210. An etch process removes, through the openings in the photoresist, the exposed antireflective coating 510 and the underling oxide layer 505. Consequently, openings, which are now aligned to the openings in the photoresist, are formed in hard mask layer 500. In other words, the photoresist pattern has been transferred to hard mask layer 500 according to the process described above. The photoresist can be subsequently removed with a wet etch process. FIG. 6 shows the patterned hard mask layer 500 after the pattern transfer process from the photoresist as described above.

Figure 7:
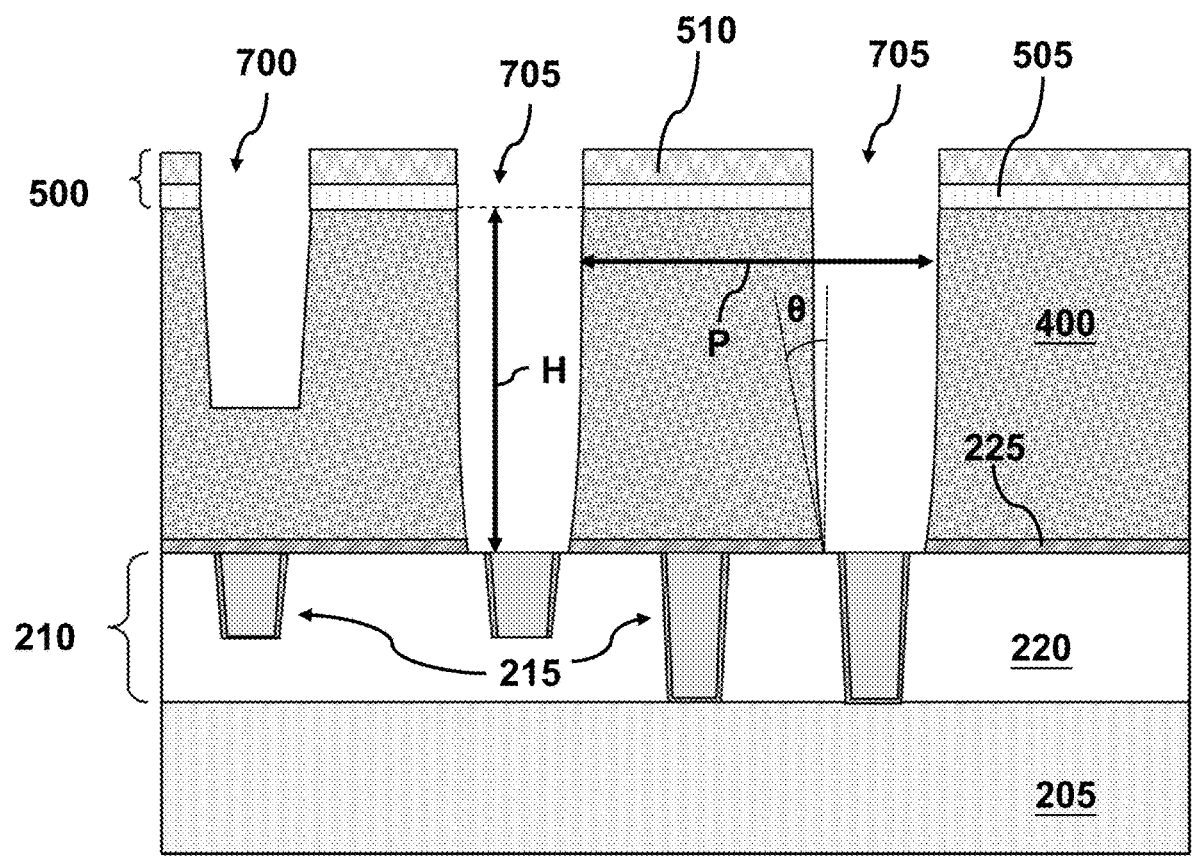

In subsequent etch and photolithography operations, in referring to FIG. 7, line openings 700 and via opening 705 (e.g., interconnect openings) are formed in treated, carbon-rich, low-k layer 400, according to operation 140 of FIG. 1. In some embodiments, line openings 700 can have a depth shorter than the thickness of treated, carbon-rich, low-k layer 400, and via openings 705 can have a depth larger than the thickness of treated, carbon-rich, low-k layer 400. As a result, respective metal contacts 215 from layer 210 can be exposed as shown in FIG. 7. In some embodiments, the etch process can be a combination of end-pointed and timed etch. For example, the etch process can automatically end point (e.g., automatic stop) on etch stop layer 225 and "breakthrough" etch stop layer 225 in a subsequent timed etch operation.

By way of example and not limitation, operation 140 includes a low pressure (e.g., between about 10 mTorr and about 60 mTorr) reactive ion etching (RIE) process that uses an inductively coupled plasma (ICP) (RIE-ICP). By way of example and not limitation, the RIE-ICP process can use an organofluorine chemistry diluted in one or more non-organic gases—for example nitrogen, argon, hydrogen, and the like. The organofluorine chemistry can include gases such as tetrafluoromethane ($CF_4$), hexafluoro-2-butyne ($C_4F_6$), octafluorocyclobutane ($C_4F_8$), or any other suitable gas. The flow rate for the organofluorine gases can range from about 10 sccm to about 300 sccm, while the flow rate for the non-organic gases can range from about 100 sccm to about 800 sccm.

According to some embodiments, in the RIE-ICP process, the plasma is formed from the gas mixture between the organofluorine chemistry and the one or more non-organic gases. A high frequency (e.g., between about 30 MHz and about 60 MHz), high power (e.g., between about 100 Watts to about 1000 Watts) signal is applied to the plasma concurrently with a low frequency (e.g., between about 10 MHz and about 30 MHz), low power (e.g., between about 50 Watts and about 500 Watts) signal. The power ratio between the high to low frequency signal can be between about 2:1 to 10:1. In some embodiments, the high frequency/high power signal produces radicals that are responsible for the chemical etch, and the low frequency/low power signal produces ions that are responsible for physical etch through ion bombardment.

In some embodiments, the RIE-ICP process produces substantially vertical via profiles in treated, carbon-rich, low-k layer 400 with a bottom sidewall angle θ that ranges between about 84° to about 90°, as shown in FIG. 7. In some embodiments, the range of sidewall angle θ (e.g., between about 84° to about 90°) is attributed to the properties of the treated, carbon-rich, low-k layer 400—such as its carbon content and density, which are responsible for the layer's etching properties. Vias with substantially vertical profiles can prevent electrical shorts between adjacent vias, when the via-pitch is reduced below about 25 nm, according to some embodiments. Further, and because of the etch loading effect, the via height H difference between isolated vias (e.g., with a pitch P greater than about 84 nm) and dense vias (e.g., with a pitch P less than about 25 nm) can be less than about 50 Å. This means, that isolated and dense vias can have a height different of about 50 Å, or less, depending on the pitch difference between the isolated and dense vias. By way of example and not limitation, via pitch P can range across substrate 205 between about 20 nm and about 130 nm. In some embodiments, these results are attributed to the elevated carbon content (e.g., between about 15 to about 20 atomic %) of treated, carbon-rich, low-k layer 400.

In referring to FIG. 1, fabrication method 100 continues with operation 150, where interconnect openings (e.g., via openings 705 and line openings 700) in treated, carbon-rich, low-k layer 400 can be filled with a metal to form an interconnect layer. In some embodiments, prior to the metal deposition, a barrier layer is conformally deposited on the exposed surfaces of line openings 700, via openings 705, and hard mask layer 500. In some embodiments, the barrier layer is configured to prevent diffusion of atoms from the metal fill through the treated, carbon-rich, low-k layer 400 to the underlying layers. By way of example and not limitation, the barrier layer can be a single layer or a stack of layers deposited, for example, by physical vapor deposition (PVD). For example, the barrier layer can be a single layer of cobalt (Co) or a layer stack with a bottom TaN layer and a top Ta layer (e.g., TaN/Ta stack). In some embodiments, a seed layer for the metal fill can be deposited with PVD on the barrier layer. Alternatively, a seed layer may not be necessary. The seed layer can act as a nucleation layer for the metal fill which can be subsequently electroplated on the seed layer. By way of example and not limitation, the seed layer can include copper (Cu) or another low resistivity metal on which Cu or a copper alloy can be electroplated on. The metal fill, as discussed above, can be electroplated to fill the interconnect openings in treated, carbon-rich, low-k layer 400.

Figure 8:
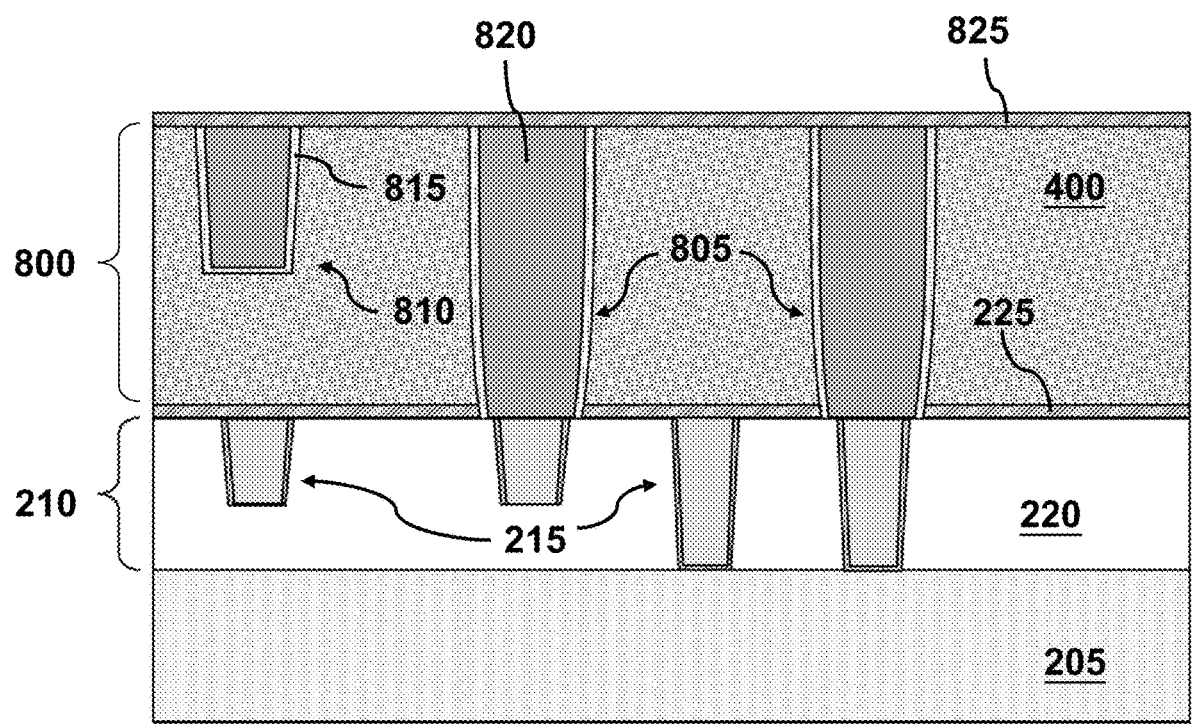
FIG. 8 is a cross-sectional view of an interconnect layer in a carbon-rich low-k interlayer dielectric layer over a partially fabricated wafer, according to some embodiments.

Once the interconnect openings (e.g., via openings 705 and line openings 700) are filled, a CMP process can polish the metal fill until hard mask layer 500 is removed and the top surface of metal fill is substantially coplanar with the top surface of the surrounding treated, carbon-rich, low-k layer 400. FIG. 8 shows the formed interconnect layer 800 with metal filled vias 805 and lines 810 (e.g., interconnects) in treated, carbon-rich, low-k layer 400 after the CMP process discussed above. Each of the vias 805 and lines 810 includes barrier layer 815 and metal fill 820. In some embodiments, an etch stop layer 825 can be deposited over the polished surface of metal fill 820 and treated, carbon-rich, low-k layer 400. Further, additional interconnect layers can be formed over interconnect layer 800 by repeating operations 120 through 150 of fabrication method 100 of FIG. 1. In some embodiments, the interconnect layers (formed over interconnect layer 800) include an ILD layer with the same characteristics as treated, carbon-rich, low-k layer 400.

The embodiments described herein are directed to a silicon-based, carbon-rich, low-k ILD layer with a carbon concentration between about 15 atomic % and about 20 atomic %, a refractive index between about 1.42 and about 1.48, a density between about 1.2 gr/cm$^3$ and about 1.4 gr/cm$^3$, and a k-value below about 3.0 (e.g., 2.9). The low-k dielectric layer can be used as an ILD layer in one or more interconnect layers (e.g., in BEOL). According to some embodiments, the properties of the carbon-rich low-k ILD layer (e.g., density, porosity, adhesion and surface quality) can be tuned by exposing the as-deposited layer to a post-deposition treatment process. The post-deposition treatment process can include an ultraviolet process, a thermal process, a plasma process, an e-beam process, or combinations thereof. The carbon-rich low-k ILD layer can be deposited by PECVD, ALD, PEALD, or e-beam deposition methods in a low oxygen environment (e.g., with a precursor to oxygen flow ratio between about 25 and about 100). Due to its carbon content, the low-k ILD layer can mitigate loading effects during a subsequent etching process and provide improved via profile control for vias that have a pitch between about 20 nm and about 130 nm (e.g., 28 nm). In some embodiments, the via height difference between isolated vias (e.g., with a pitch P greater than about 84 nm) and dense vias (e.g., with a pitch P less than about 25 nm) formed in the carbon-rich, low-k ILD layer can be about 50 Å or less. Further, the bottom sidewall angle for vias formed within the carbon-rich, low-k ILD layer described herein can range from about 84° to about 90° (e.g., about 86°).

In some embodiments, a method includes depositing a dielectric layer, over a substrate, with a dielectric material having a dielectric constant below 3.9 and a carbon atomic concentration between about 15% and about 20%; exposing the dielectric layer to a thermal process configured to outgas the dielectric material; etching the dielectric layer to form openings; and filling the openings with a conductive material to form conductive structures.

In some embodiments, a structure includes a substrate; a dielectric layer, over the substrate, with a dielectric constant below 3.9 and a carbon atomic concentration between about 15% and about 20%. The structure further includes conductive structures in the dielectric layer.

In some embodiments, a method includes depositing, over a substrate, a dielectric material with a thermal deposition method or an electron beam (e-beam) deposition method, where the dielectric material has a dielectric constant below 3.9. The method further includes forming a treated dielectric material with a carbon atomic concentration between about 15% and about 20% and a density between about 1.2 gr/cm3 and about 1.4 gr/cm3; etching the treated dielectric material to form openings; and filling the openings with a conductive material.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing, using an electron beam (e-beam) assisted deposition method, a dielectric layer on a surface of a substrate at a temperature between about 24° C. and about 300° C., wherein the dielectric layer, as-deposited by the e-beam assisted deposition method, comprises a dielectric constant lower than about 3.9 and a carbon atomic concentration between about 15% and about 20%;
forming pores in the dielectric layer;
treating the dielectric layer having pores in a gas mixture comprising additives to increase the carbon atomic concentration;
etching the dielectric layer having pores to form openings; and
filling the openings with a conductive material to form conductive structures.

2. The method of claim 1, further comprising exposing the as-deposited dielectric layer to an e-beam at a temperature between about 100° C. and about 300° C. and in an ambient comprising one or more of helium, argon, nitrogen, oxygen, hydrogen, carbon monoxide, carbon dioxide, and nitrous oxide.

3. The method of claim 1, wherein depositing the dielectric layer with the e-beam assisted deposition method comprises depositing the dielectric layer using a precursor comprising tetraethyl orthosilicate (TEOS), methyl-di-ethoxy-dilane (mDEOS), hexamethyldisiloxane (HMDSO), or tetra-methylsilane (4MS).

4. The method of claim 3, wherein depositing the dielectric layer with the e-beam assisted deposition method further comprises depositing the dielectric layer using a porogen precursor comprising propane ($C_3H_8$), benzene ($C_6H_6$), or alpha-terpinene (ATRP) ($C_{10}H_{16}$).

5. The method of claim 1, wherein treating the dielectric layer having pores comprises annealing the dielectric layer having pores in the gas mixture.

6. The method of claim 1, wherein treating the dielectric layer having pores comprises performing a thermal process to strengthen atomic bonds in the dielectric layer having pores.

7. A method, comprising:
forming, over a substrate, a porous dielectric material comprising a carbon atomic concentration;
treating the porous dielectric material with a two-step treatment, wherein treating the porous dielectric material comprises:
annealing the porous dielectric material at a temperature above 450° C. and in a gas mixture comprising additives to increase the carbon atomic concentration of the porous dielectric material; and
after the annealing, exposing the porous dielectric material to a plasma process performed at a lower temperature than that of the annealing;
etching the treated porous dielectric material to form openings; and
filling the openings with a conductive material.

8. The method of claim 7, wherein forming the porous dielectric material comprises performing an atomic layer deposition process with:
a deposition temperature between about 100° C. and about 500° C.;
deposition reactant gases comprising nitrogen, argon, oxygen, helium, hydrogen, or combinations thereof; and
a deposition pressure between about 10 mTorr and about 10 Torr.

9. The method of claim 7, wherein depositing forming the porous dielectric material comprises performing an e-beam deposition process comprising:
a deposition temperature between about 24° C. and about 300° C.;
deposition reactant gases comprising nitrogen, argon, helium, hydrogen, or combinations thereof;
a deposition pressure between about 0.01 mTorr and about 30 mTorr; and
an e-beam power from about 0.5 kW to about 30 kW.

10. The method of claim 7, wherein treating the porous dielectric material comprises forming a treated dielectric material with a refractive index between about 1.42 and about 1.48.

11. The method of claim 7, wherein forming the porous dielectric material comprises depositing the porous dielectric material using one or more of a plasma-enhanced chemical vapor deposition (PECVD) process, an atomic layer deposition (ALD) process, a plasma assisted atomic layer deposition process (PEALD), and an electron beam (e-beam) assisted deposition process.

12. The method of claim 7, wherein the annealing tunes film properties of the porous dielectric material including one or more of density, porosity, adhesion, and surface quality.

13. The method of claim 7, further comprising adding a porogen precursor during forming the porous dielectric material to form pores in the porous dielectric material.

14. The method of claim 7, wherein forming the porous dielectric material comprises forming a network of pores.

15. The method of claim 7, wherein the additives comprise silane, tri-methylsilane (3MS), tetra- methylsilane (4MS), methyl-diethoxy-dilane (mDEOS), or combinations thereof.

16. A method, comprising:
providing a substrate with a contact layer;
depositing, on the contact layer, using an atomic layer deposition (ALD) process, a dielectric comprising a first k-value greater than about 3.0 and less than about 3.9, a material with a first atomic concentration, and a carbon atomic concentration;
forming pores in the dielectric;
treating the dielectric having pores to convert the dielectric having pores to a treated dielectric comprising a second k-value lower than the first k-value and the material with a second atomic concentration different from the first atomic concentration,
wherein treating the dielectric having pores comprises:
treating the dielectric having pores in a gas mixture comprising additives to increase the carbon atomic concentration;
exposing the dielectric having pores to an ultra-violet (UV) treatment to densify the dielectric having pores; and
after exposing the dielectric having pores to the UV treatment, exposing the dielectric having pores to a plasma treatment.

17. The method of claim 16, wherein treating the dielectric having pores further comprises exposing the dielectric having pores to a thermal process comprising annealing temperatures between about 100° C. and about 500° C. in one or more of a helium gas, argon gas, nitrogen gas, hydrogen gas, carbon monoxide gas, carbon dioxide gas, nitrous oxide gas, and combinations thereof.

18. The method of claim 17, wherein exposing the dielectric having pores to the plasma treatment occurs at a temperature equal to or lower than that of the thermal process.

19. The method of claim 16, wherein depositing the dielectric comprises using an e-beam to promote a reaction between a precursor and reactant gases on a surface of the substrate.

20. The method of claim 16, wherein treating the dielectric having pores in a gas mixture comprises annealing the dielectric having pores to densify the dielectric having pores.

\* \* \* \* \*

UNITED STATES PATENT AND TRADEMARK OFFICE
CERTIFICATE OF CORRECTION

PATENT NO. : 11,749,563 B2  
APPLICATION NO. : 16/138106  
DATED : September 5, 2023  
INVENTOR(S) : Liou et al.

Page 1 of 1

It is certified that error appears in the above-identified patent and that said Letters Patent is hereby corrected as shown below:

In the Claims

Column 11, Claim 3, Line 23, delete "dilane" and insert -- silane --, therefor.

Column 11, Claim 3, Line 23, delete "(IIMDSO)," and insert -- (HMDSO), --, therefor.

Column 11, Claim 9, Line 63, after "wherein", delete "depositing".

Column 12, Claim 15, Line 28, delete "tetra- methylsilane" and insert -- tetra-methylsilane --, therefor.

Column 12, Claim 15, Line 29, delete "dilane" and insert -- silane --, therefor.

Signed and Sealed this  
Twenty-fourth Day of October, 2023

Katherine Kelly Vidal  
*Director of the United States Patent and Trademark Office*